(12) United States Patent
Kazanchian

(10) Patent No.: US 8,610,573 B2
(45) Date of Patent: Dec. 17, 2013

(54) RADIO FREQUENCY MODULE AND METHODS OF TRANSMITTING/RECEIVING DATA

(76) Inventor: Armen E. Kazanchian, Hermosa Beach, CA (US)

( * ) Notice: Subject to any disclaimer, the term of this patent is extended or adjusted under 35 U.S.C. 154(b) by 1112 days.

(21) Appl. No.: 12/558,484

(22) Filed: Sep. 11, 2009

(65) Prior Publication Data

US 2010/0060454 A1 Mar. 11, 2010

Related U.S. Application Data

(60) Provisional application No. 61/096,163, filed on Sep. 11, 2008.

(51) Int. Cl.
*G08B 13/14* (2006.01)

(52) U.S. Cl.
USPC ...................... 340/572.1; 340/572.8; 370/338

(58) Field of Classification Search
USPC ............... 340/572.1, 572.4, 572.8, 573.1; 235/380, 383, 487, 492, 385; 343/700, 343/702, 841, 847; 370/337, 338, 343, 344, 370/349, 394; 455/454, 553.1
See application file for complete search history.

(56) References Cited

U.S. PATENT DOCUMENTS

| | | | | |
|---|---|---|---|---|
| 7,239,625 B1* | 7/2007 | Tse et al. | ....................... | 370/349 |
| 7,259,673 B2* | 8/2007 | Deeds | ......................... | 340/572.1 |
| 7,310,067 B1* | 12/2007 | Zhu et al. | ...................... | 343/702 |
| 2003/0025604 A1* | 2/2003 | Freeman | .................... | 340/573.1 |
| 2003/0163748 A1* | 8/2003 | Calkins et al. | ................ | 713/500 |
| 2006/0139167 A1* | 6/2006 | Davie et al. | ............. | 340/539.13 |
| 2007/0013610 A1* | 1/2007 | Mooney et al. | ................ | 345/2.1 |
| 2007/0159332 A1* | 7/2007 | Koblasz | ..................... | 340/572.1 |
| 2008/0143611 A1* | 6/2008 | Wang | ............................ | 343/702 |
| 2009/0101403 A1* | 4/2009 | Tsai et al. | ..................... | 174/388 |
| 2010/0029325 A1* | 2/2010 | Wang et al. | ................ | 455/553.1 |

* cited by examiner

*Primary Examiner* — Hung T. Nguyen
(74) *Attorney, Agent, or Firm* — Alvin R. Wirthlin

(57) ABSTRACT

A wireless module is configurable by a user to operate in different modes as a transmitter, receiver, transceiver, and repeater. A method of transmitting and receiving data while substantially reducing or eliminating interference from competing frequency bands, including Wi-Fi systems, as well as a method of transmitting data with a high degree of certainty without requiring an acknowledgement receipt, negotiation, or hand-shaking from a down line transceiver, receiver and/or repeater are disclosed.

11 Claims, 16 Drawing Sheets

| Mode | Description | Mode Selection Inputs | | | | | | Learn/Status |
|---|---|---|---|---|---|---|---|---|
| | | 2 | 1 | 0 | | | | |
| 0 | Active RFID Transmitter | 0 | 0 | 0 | IN3 | IN2 | IN1 | TX LED |
| 1 | 3 input Switch Logic Transmitter | 0 | 0 | 1 | IN3 | IN2 | IN1 | TX LED |
| 2 | Serial UART Transceiver, 9600,N,8,1 | 0 | 1 | 0 | TXD IN | RXD OUT | LOGIC I/O | X |
| 3 | Serial UART Transceiver, 9600,N,8,1 | 0 | 1 | 1 | TXD IN | RXD OUT | LOGIC I/O | ESN LEARN NETWORK |
| 4 | 3 Output Switch Logic Receiver - 500ms | 1 | 0 | 0 | OUT 3 | OUT 2 | OUT 1 | X |
| 5 | 3 Output Switch Logic Receiver - 500ms | 1 | 0 | 1 | OUT 3 | OUT 2 | OUT 1 | ESN LEARN NETWORK |
| 6 | 3 Output Switch Logic Receiver - 20ms | 1 | 1 | 0 | OUT 3 | OUT 2 | OUT 1 | X |
| 7 | 3 Output Switch Logic Receiver - 20ms | 1 | 1 | 1 | OUT 3 | OUT 2 | OUT 1 | ESN LEARN NETWORK |
| | Pin Number | 3 | 17 | 16 | 7 | 6 | 5 | 4 |

FIG. 7A

ACTIVE RFID TRANSMITTER

SERIAL NETWORK RFID RECEIVER

3 INPUT LOGIC SWITCH TRANSMITTER

3 OUTPUT LOGIC SWITCH RECEIVER

3 INPUT LOGIC SWITCH TRANSMITTER

3 OUTPUT LOGIC SWITCH NETWORK RECEIVER

RADIO FREQUENCY MODULE AND METHODS OF TRANSMITTING/RECEIVING DATA

RELATED APPLICATIONS

This application claims the benefit of U.S. Provisional Application No. 61/096,163 filed on Sep. 11, 2008, the subject matter of which is hereby incorporated by reference in its entirety.

BACKGROUND OF THE INVENTION

This invention relates generally to wireless transmitters and receivers, and more particularly to a wireless module that can be configured to operate as a transmitter, receiver, transceiver, and/or repeater. This invention also relates to a method of transmitting and receiving information while substantially reducing or eliminating interference from competing Wi-Fi systems, as well as a method of transmitting data with a high degree of certainty without requiring an acknowledgement receipt, negotiation, or hand-shaking from a down line transceiver, receiver and/or repeater.

Radio Frequency (RF) modules, such as transceivers, transmitters and receivers, are employed in many different products, including mobile phones, personal computers, wireless networks, gaming devices, wireless sensors, radios, walkie-talkies, and so on. Consumer demand for more compact wireless products has led to increasingly smaller RF modules. However, prior art solutions have been inadequate to reduce the RF module even further since the matching and filtering components of the module are typically in linear alignment with an onboard antenna. Prior attempts to move the antenna and/or matching and filtering components have been for the most part futile as the transmission/reception performance is often reduced.

Prior art RF modules are also limited in the type and number of tasks they can perform. For those modules that are configurable as transmitters or receivers for example, expert knowledge of wireless systems and design is often required to manipulate such systems.

Another area where prior art solutions are limited is with Wi-Fi technology and the interference between other RF devices on the 2.4 GHz frequency band. Wi-Fi uses a large amount of the 2.4 GHz band, and at large bandwidths, about one-third of the band per channel is consumed per Wi-Fi node. Currently, other 2.4 GHz wireless devices, such as Bluetooth, operate around Wi-Fi by employing a handshake or bi-directional system were the transmitter sends data and the receiver echoes back an acknowledgment that the data packet was received. The transmitter then sends the next packet to the receiver. If no data was received the two radios keep talking back and forth on many channels until they find a clear channel to talk on. This consumes quite a bit of current and requires a bi-directional link. This also restricts the devices to single point to single point communication. Point to multi-point or poing to multi-point or multi-point to multi-point communication is not possible under this system, since one transmitter sends and waits for a response to confirm receipt of its data. If there are many receivers, it is not possible for more than one receiver to talk back at a time.

It would therefore be desirable to provide a radio frequency module that overcomes at least some of the disadvantages of the prior art.

BRIEF SUMMARY OF THE INVENTION

According to one aspect of the invention, a radio frequency module includes a base member having a printed circuit board with a first surface and a second surface. A transceiver assembly is located on the printed circuit board and includes a transceiver and a matching/filtering network with first and second ends. The matching/filtering network has a plurality of series connected passive electrical components in a linear arrangement, with the first end thereof electrically connected to the transceiver. A ground plane is formed on the first surface and surrounds at least a substantial portion of the transceiver assembly. A radio frequency shield is electrically coupled to the ground plane and covers at least a substantial portion of the transceiver assembly. A chip antenna is located on the first surface of the printed circuit board outside of the shield and extends generally parallel with the matching/filtering network. A radio feed point extends between the chip antenna and the second end of the matching/filtering network. The antenna together with the matching/filtering network and feed point form a generally U-shape configuration.

According to a further aspect of the invention, a method of wirelessly transmitting data comprises transmitting a data packet at a plurality of different frequencies to thereby substantially reduce or eliminate radio frequency interference.

According to yet a further aspect of the invention, a method of wirelessly transmitting data comprises: transmitting a data packet on at least one frequency from a first location, the data packet including at least one repeat signal with an initialized value for a first transmission; receiving the data packet at a second location; determining whether the at least one repeat signal is at the initialized value; transmitting the data packet to a third location with a modified repeat bit when the at least one repeat signal is the initialized value; and discarding the data packet when the value of the at least one repeat signal is different from the initialized value.

BRIEF DESCRIPTION OF THE DRAWINGS

The foregoing summary as well as the following detailed description of the preferred embodiments of the present invention will be best understood when considered in conjunction with the accompanying drawings, wherein like designations denote like elements throughout the drawings, and wherein:

FIG. 7A is a chart showing the plurality of operating modes depending on the logic level of mode selection input pins;

Figure 1:
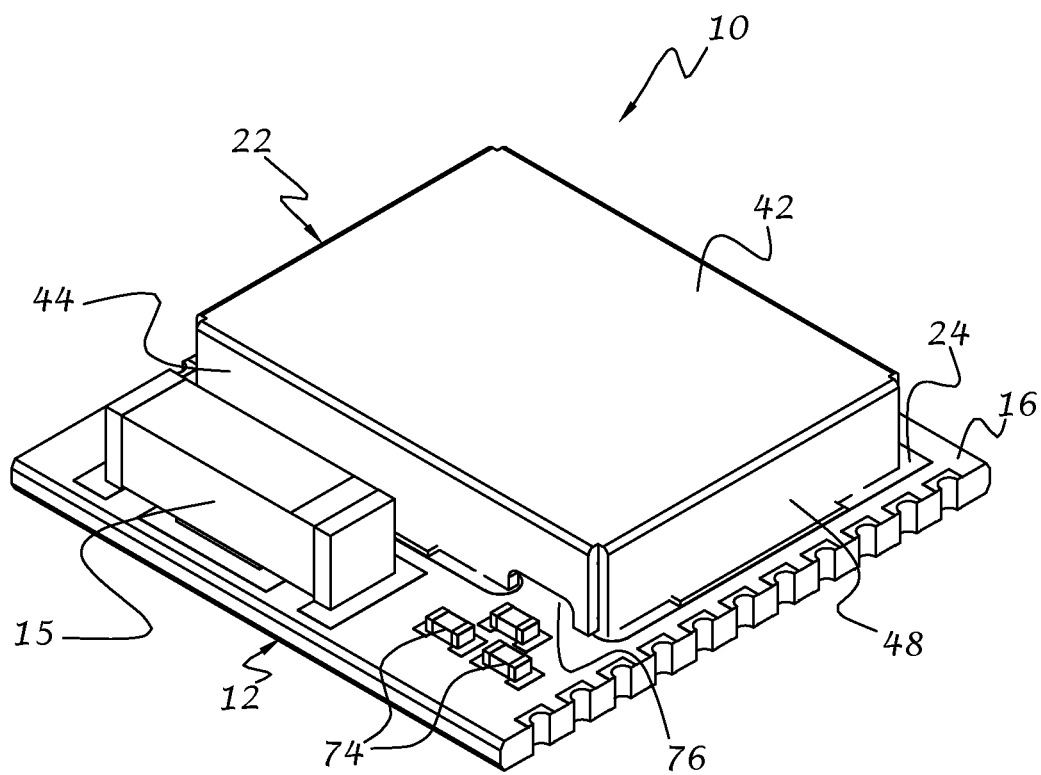
FIG. 1 is an isometric view of a radio frequency (RF) module in accordance with the invention.
Figure 2:
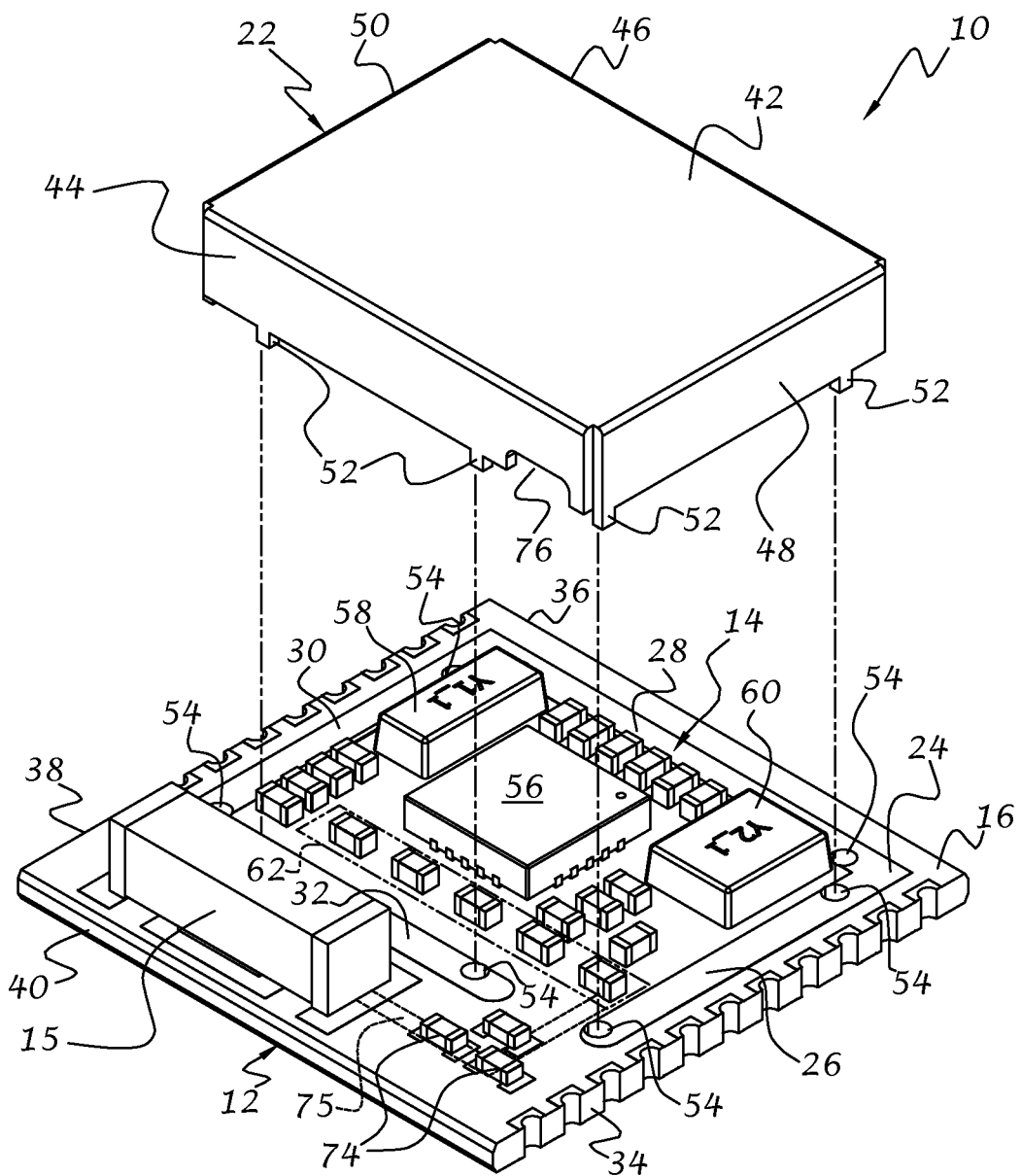
FIG. 2 is an isometric exploded view of the RF module of FIG. 1.
Figure 3:
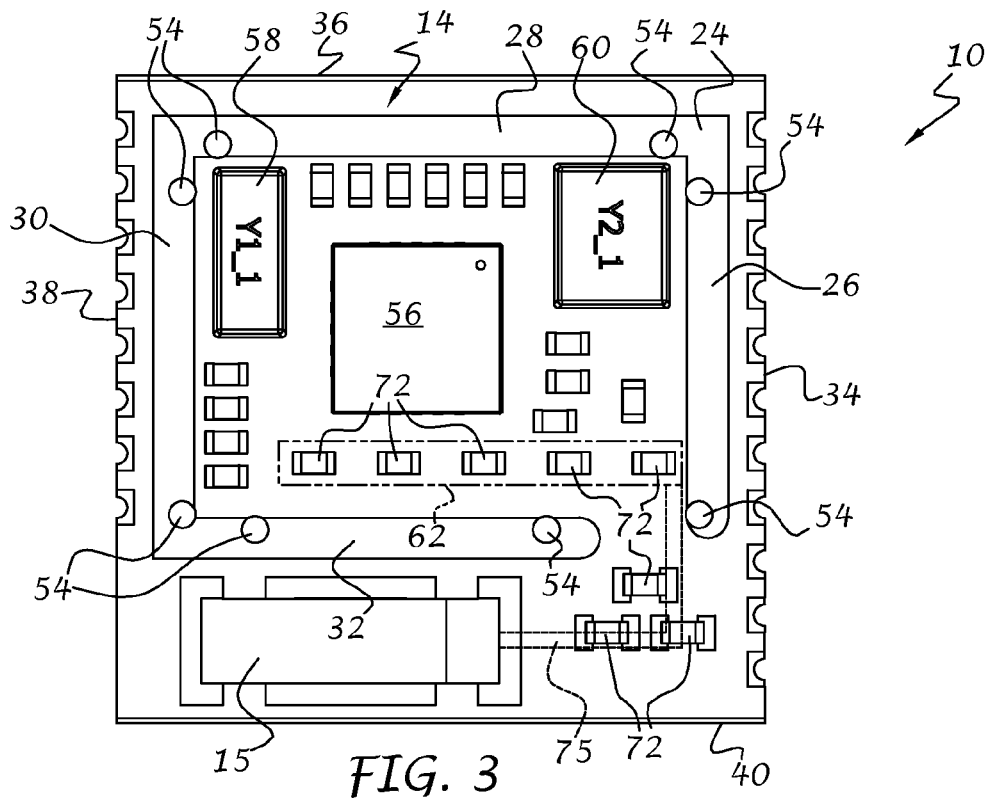
FIG. 3 is a top plan view of the RF module with the shield removed to show the electronic components mounted on a printed circuit board.

It is noted that the drawings are intended to depict only typical embodiments of the invention and therefore should not be considered as limiting the scope thereof. It is further noted that the drawings are not necessarily to scale. The invention will now be described in greater detail with reference to the accompanying drawings.

DETAILED DESCRIPTION OF THE INVENTION

Referring now to the drawings, and to FIGS. 1-4 in particular, a radio frequency (RF) module 10 in accordance with the present invention is illustrated. The RF module 10 is preferably a fully integrated radio transceiver module that preferably operates at the 2.4 GHz frequency band or above. However, it will be understood that many principles of the present invention as set forth below can also be used in RF modules that operate below or above the 2.4 GHz frequency band. Accordingly, it will be understood that the particular values used throughout the specification for components, frequencies, ranges and so on, are by way of example and can greatly vary depending on the particular applications in which the RF module 10 is incorporated. As such, the RF module 10 can be incorporated into final products for providing point to point, point to multipoint and/or multipoint to multipoint digital wireless communications. The RF module 10 can also be adapted for use with any type of wireless device where the wireless transmission and/or reception of signals is desired, including but not limited to, active RFID, long range RFID, remote control, light controls, home automation, alarm security, keyless entry, perimeter monitoring, PC keyboard security, wireless keyboard, wireless mouse, TV remote, home stereo remote, asset tracking, wireless PTT, remote switches, remote terminals, wireless RS 232 DB9, wireless RS 485, temperature control, HVAC, meter reading, data acquisition, inventory control, key fob remotes, industrial controls, vending machines, and so on.

The RF module 10 of the present invention preferably includes a printed circuit board (PCB) 12 or the like with a transceiver assembly 14 and chip antenna 15 located on a first or upper surface 16 of the PCB and a plurality of connector pads 18A-18S located on the second or lower surface 20 of the PCB 12. The transceiver assembly 14 includes a plurality of electrical components, described in further detail below, that are preferably mounted on the upper surface 16 of the PCB 12. In this manner, the RF module 10 is arranged as a surface-mount device with the connector pads 18A-18S capable of being surface mounted to corresponding pads (not shown) of a motherboard or other PCB for particular applications. A radio frequency shield 22 is connected to the upper surface 16 of the PCB 12 and is adapted to shield the electronic components of the transceiver assembly 14 from outside interference to thereby stabilize performance of the RF module 10 during use.

The PCB 12 preferably includes a multi-layer circuit board to minimize the footprint of the RF module 10. In addition, the internal circuit layout of the PCB 12 is preferably arranged so that all ground sided components on the PCB 12 face the shield 22 for better performance as well as better yield during production since issues related to component shift and spacing with respect to the shield 22 are eliminated. A ground plane 24 is formed on the upper surface 16 of the PCB and includes ground plane segments 26, 28, 30 and 32 that are preferably parallel with edges 34, 36, 38 and 40, respectively, of the PCB. The ground plane 24 preferably surrounds at least a substantial portion of the transceiver assembly 14.

The RF shield 22 is preferably constructed of a radio frequency shielding material and includes a front wall 44, rear wall 46 and side walls 48, 50 that extend downwardly from an upper wall 42. The lower edges of the front, rear and side walls are preferably soldered to their respective ground plane segments. A pair of tabs 52 preferably extend downwardly from each wall 44-50 and are received into corresponding holes 54 for aligning the shield 22 with the ground plane 24. The holes 54 can be plated through-holes and the tabs can be soldered in the through-holes for added strength. Preferably, the tabs 52 do not extend past the lower surface 20 of the PCB so that the RF module can be surface-mounted to another motherboard or PCB without interference.

Figure 4:
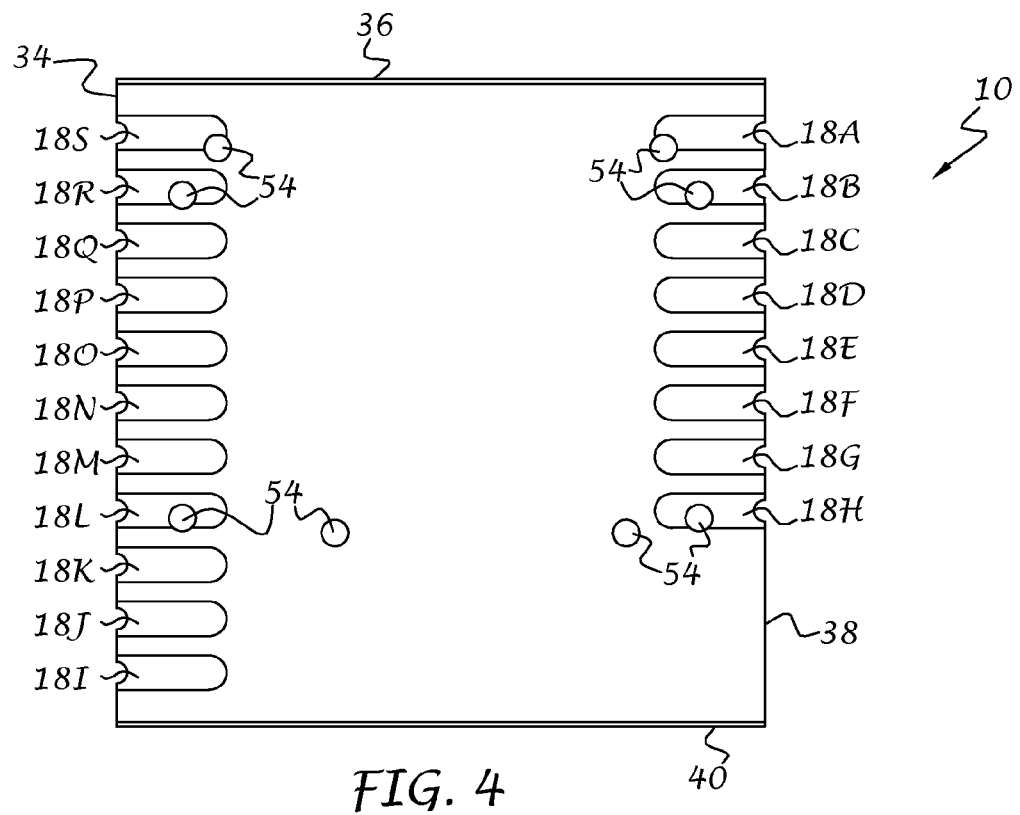
FIG. 4 is a bottom plan view of the RF module.
Figure 5:
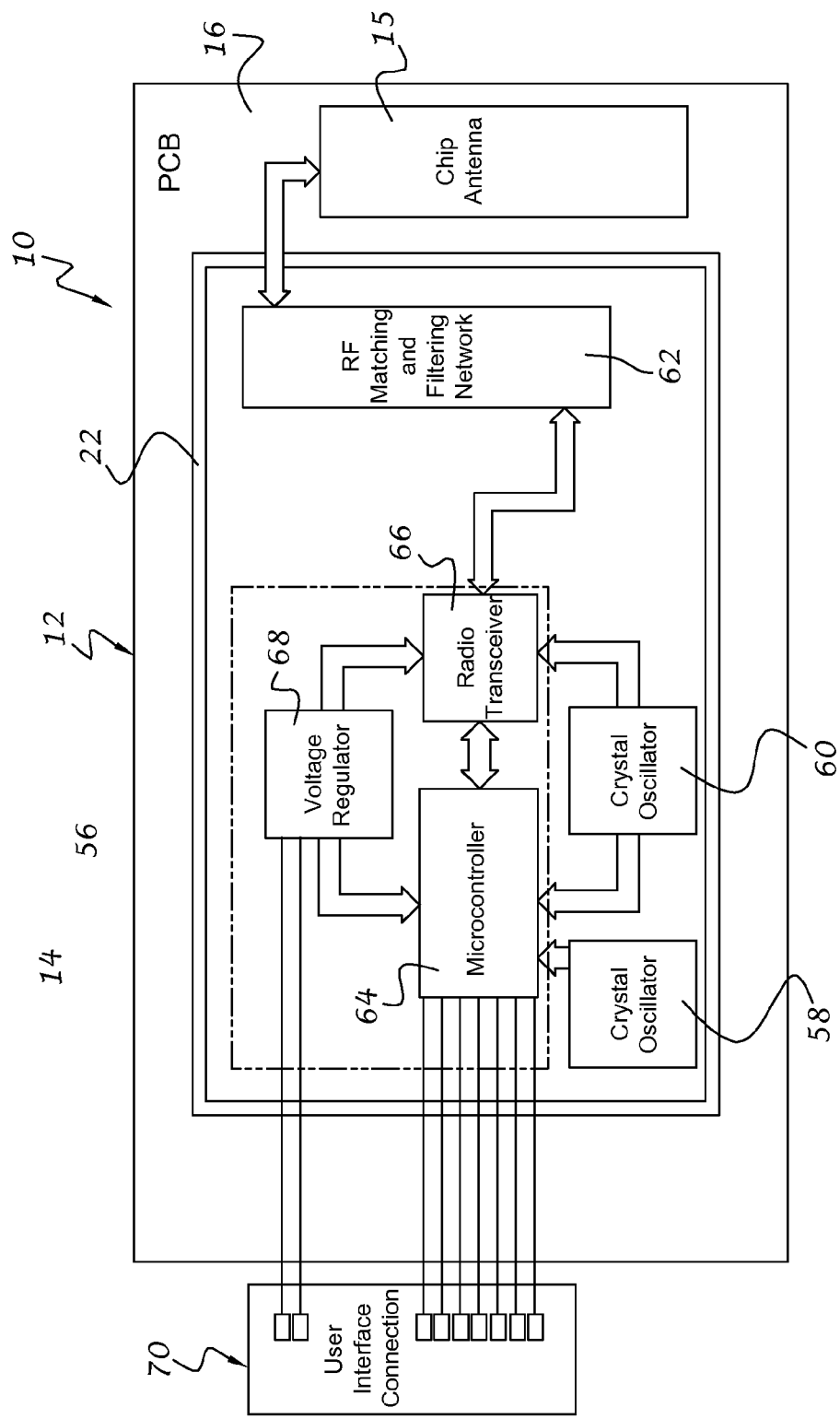
FIG. 5 is a block diagram of the electrical circuitry of the RF module.

With additional reference to FIG. 5, the transceiver assembly 14 preferably includes an integrated chip (IC) transceiver 56 connected to a first crystal oscillator 58, an optional second crystal oscillator 60, and a radio frequency matching/filtering network 62. The IC transceiver 56 preferably includes a microcontroller 64, a radio transceiver 66 in communication with the microcontroller, and a voltage regulator 68 connected to the microcontroller and radio transceiver. A user interface connector 70 provides power to the voltage regulator 68 and logic signals directly to the microcontroller 64 via a motherboard (not shown) or other external connection. The connector 70 is preferably in the form of pads 18A-18F (FIG. 4) but can additionally or alternatively be in the form of pin connectors, edge terminals, and so on.

The crystal oscillator 58 is connected to the microcontroller 64 and is preferably in the form of a 32 KHz crystal that provides a stable time base for a real time clock for saving power by precise on and off timing between two or more RF modules 10. The crystal oscillator 60 is connected to the microcontroller 64 and radio transceiver 66 and is preferably in the form of a 16 MHz crystal that is used as the radio and controller clock and is multiplied up to produce a 2.4 GHz radio frequency.

The RF matching/filtering network 62 is also connected to the chip antenna 15 and preferably comprises a plurality of passive electrical components 72 including inductors and capacitors connected in series and arranged in an in-line configuration that extends generally parallel with the ground plane segment 32 inside the shield 22. The inductors and capacitors 72 form a filter and differential antenna connection between the IC transceiver 56 and the chip antenna 15. Preferably, the RF matching/filtering network 62 is located very close to the front wall 44 of the of the RF shield 22. If needed, RF output network units 74, preferably in the form of inductors and/or capacitors, are located at the internal feed point 75 (shown in broken line in FIGS. 2 and 3) of the chip antenna 15 outside of the RF shield 22 to match the chip antenna to the components inside the shield. The internal feed point 75 is fed through the front wall 44 of the shield 22 at a location coincident with a small elongate opening 76 (FIGS. 1 and 2) formed in the front wall. When the RF module 10 is configured as a 2.4 GHz device, the feed point is also configured at 2.4 GHz.

Preferably, the chip antenna 15 is located close to the RF shield 22 and is generally parallel with the front wall 44 of the shield and the RF matching/filtering network 62. With this arrangement, the antenna 15 together with the matching/filtering network 62 and feed point form a U-shape. This configuration results in a good antenna pattern and thus improved range performance of the RF module 10. This is a great improvement over prior art configurations where the antenna is required to be in line with the matching network, resulting in a module that is at least twice the size of the RF module of the present invention. Accordingly, the RF module 10 of the present invention is half the size of prior art modules and, with the shield configuration, allows the RF module 10 to still have an effective antenna pattern without undesirable antenna feedback incident on the RF matching/filtering network 62.

In operation, electrical current from the power source flows through the RF matching/filtering network 62, the internal 2.4 GHz radio feed point, and through the chip antenna 15 until it reaches the high energy point of the antenna, which is directly next to the junction point between the start of the matching network and the IC transceiver 56. This efficient energy transfer, together with the grounded shield configuration on the PCB 12 and particular location and orientation of the chip antenna 15 and RF matching/filtering network 62 with respect to the front wall 44 of the shield 22, allows the antenna and shield to effectively function together as a single antenna structure, to thereby function as a larger antenna in a smaller space when compared to prior art solutions. The shield 22 also provides mechanical protection for the chip antenna 15.

In accordance with one embodiment of the invention, the shield 22 is preferably proportionate in size to the chip antenna 15 and the height of the shield is approximately the same height of the chip antenna. Preferably, ration of the width and length of the shield 22 to the width and length of the chip antenna 15 is approximately 4:1. However, it will be understood that other ratios and/or dimensions can be used for the shield and chip antenna. In accordance with an exemplary embodiment of the invention, the size of the RF module 10 is approximately 15 mm×15 mm×2 mm. However, it will be understood that the RF module 10 can greatly vary in size.

Figure 6:
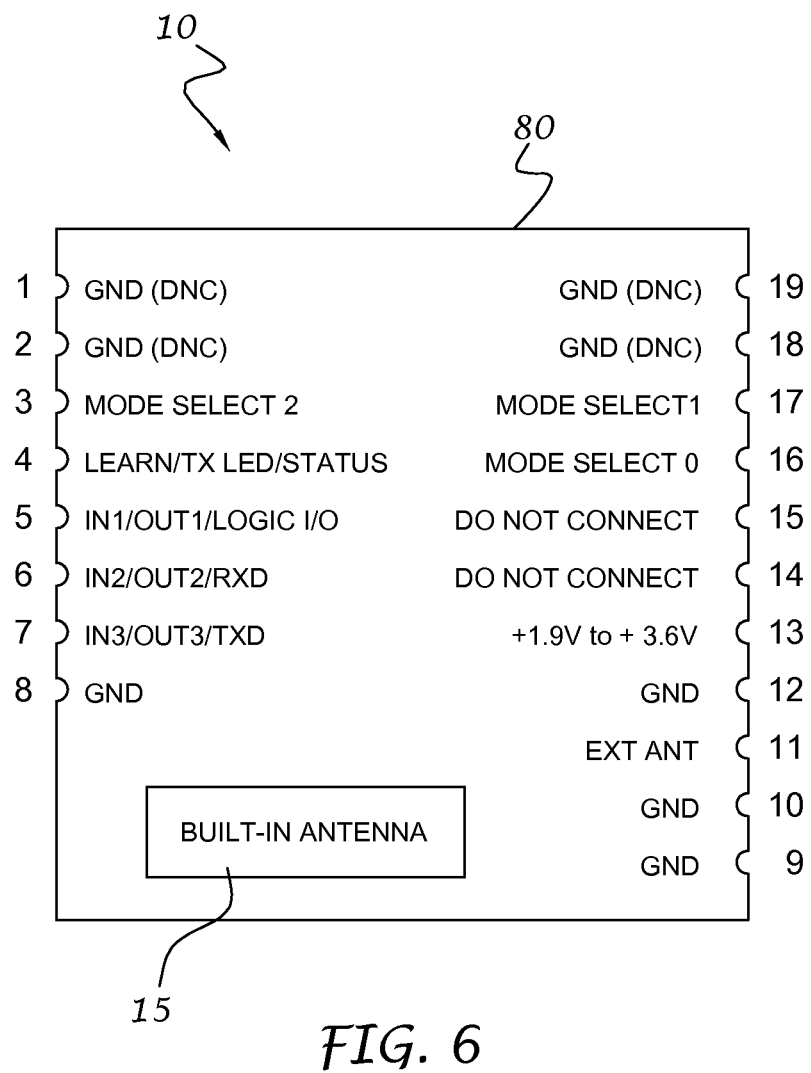
FIG. 6 is a diagram showing the pin locations of the RF module.

Referring now to FIGS. 4 and 6, the pads 18A-18S located on the lower surface 20 of the PCB 12 correspond to pins 1-19, respectively, of the pin layout diagram 80 of FIG. 6. As shown, pins 1, 2, 8, 9, 10, 12, 18 and 19 are labeled as GND or ground, with pins 9, 10 and 12 available for connection by a user. Pins 3, 16 and 17 are mode select pins for programming or setting the RF module 10 in one eight different transmitter/transceiver/receiver operating modes. Pin 4 enables the user to select a "learn" mode wherein the RF module 10 learns one or more electronic serial numbers (ESN) from another RF module or a "status" mode. Preferably, pin 4 is bidirectional to be an input when in the "learn" state and an output when in the "status" state. The learn function allows the user to press the LEARN button on one module and that unit goes into an acquisition mode, then the user causes another unit (a transmitter) to transmit, the original unit learns the Electronic Serial Number auto transmitted by the transmitter. Each module can preferably hold many ESNs which are used to form simple networks and associate transceivers to each other, without the user needing to have extensive knowledge of how a wireless network works. The ESN is also a number that can be read by the receiver and communicated to the user for identification purposes when the user wants to use a RFID mode. Pins 5-7 can be selected to perform as serial UART transceivers, receivers, three-input switch logic transmitters, or three-output switch logic receivers. Finally, pin 13 is for powering the RF module 10. Although the above-described pin layout is preferred, it will be understood that other pin layout configurations and/or options can be provided without departing from the spirit and scope of the present invention.

Figure 7:
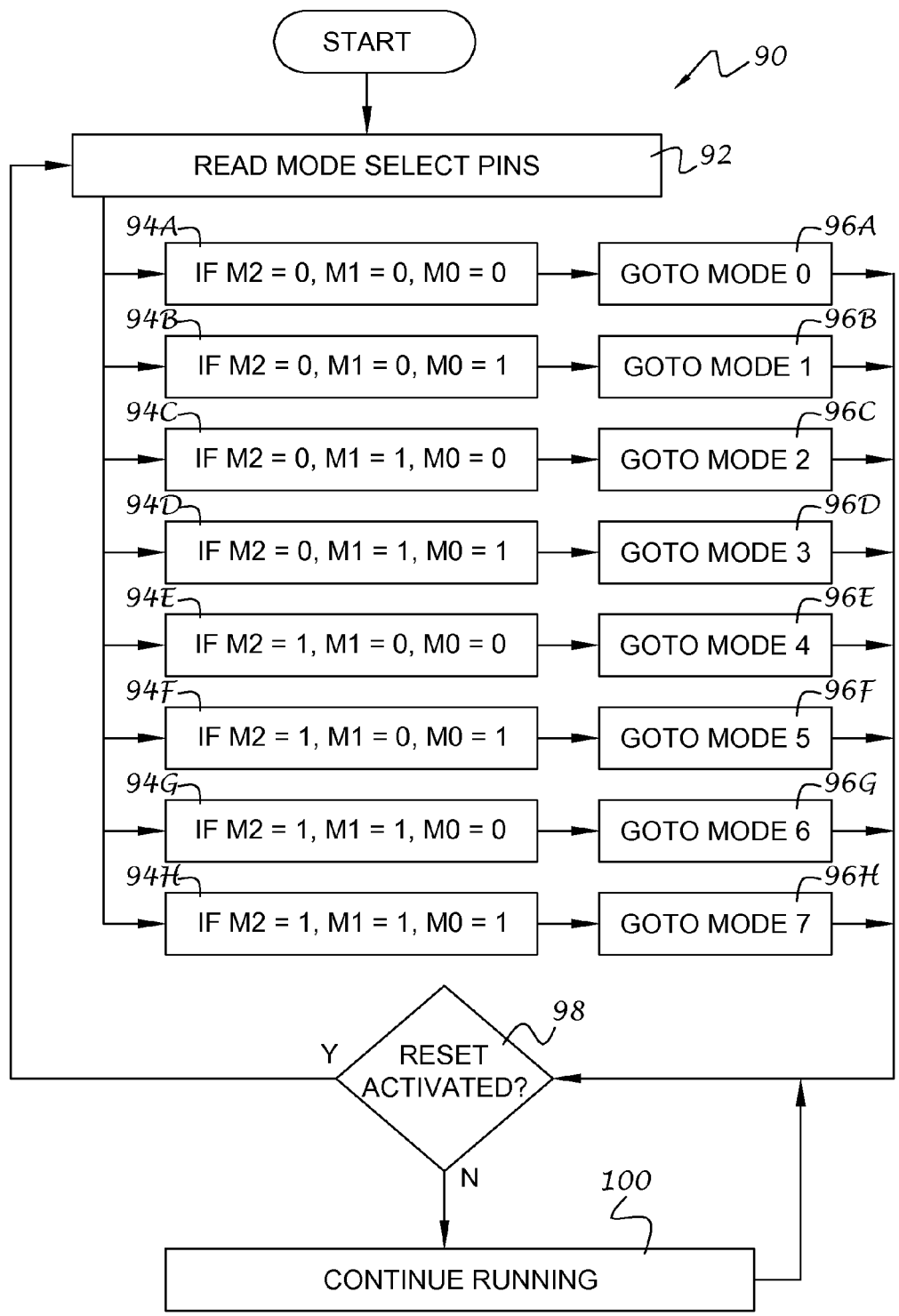
FIG. 7 is a block diagram showing a method of selecting one of a plurality of operating modes of the RF module.

A method 90 of selecting one of eight operating modes for the RF module 10 is illustrated in FIG. 7 while a chart showing different operations of each mode is shown in 7A. The selecting method 90 includes reading the mode select pins 3, 17 and 16 at block 92, then determining if a logical high or "1" is present on one or more of the pins 3, 17 and 16, as shown in blocks 94A-94H, then selecting which mode (0-7) the RF module 10 will assume, as shown in blocks 96A-96H, respectively. If for example pins 3, 17 and 16 are at a logical low or "0", then mode 0 is selected. Likewise, if pins 3, 17 and 16 are at a logical high, then mode 7 is selected. At block 98, if it has been determined that a mode reset has been actuated, the mode select pins are read again to determine a new operating mode of the RF module 10. Otherwise, the RF module will continue with the present mode, as shown at block 100. In this manner, the RF module can be used many times in many different modes without the need to purchase a different modules for different applications.

As shown in FIG. 7A, once an operating mode has been selected, the pins 7, 6 and 5 are automatically set to receive or transmit data. The learn/status pin 4 can also be actuated in modes 0, 1, 2, 3, 4, 5, 6, and 7 to either transmit a visual signal, such as driving a LED for example, or learning one or more ESN's. It will be understood that the values under the "Description" column are given by way of example only and can greatly vary without departing from the spirit and scope of the present invention.

Figure 8A:
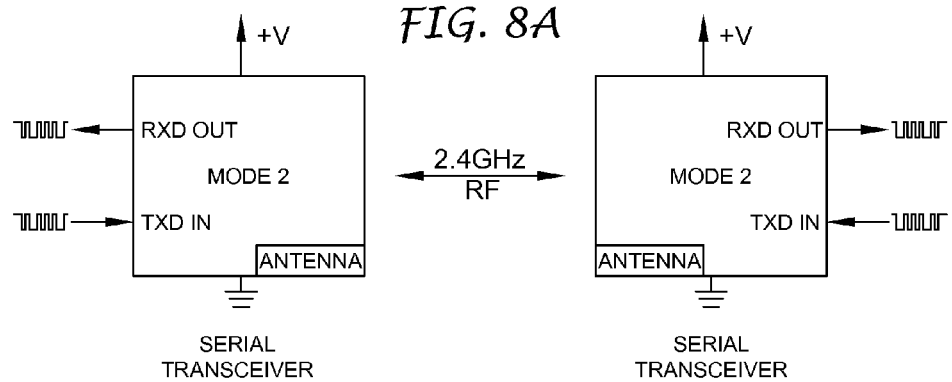
FIGS. 8A to 8N illustrate how the RF module of the present invention can be used in different combinations of transceivers/transmitters and transceivers/receivers in accordance with several exemplary embodiments of the invention.
Figure 8B:
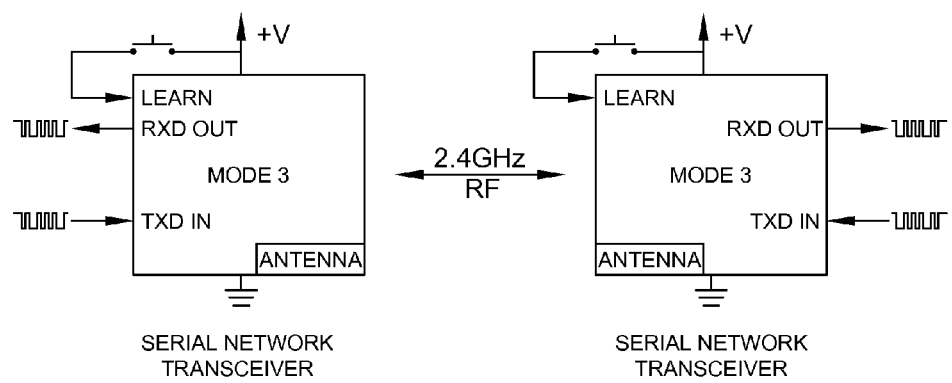
Figure 8C:
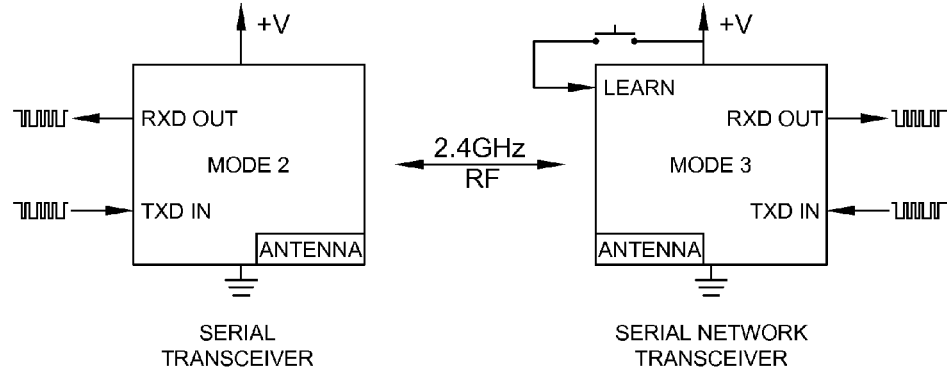
Figure 8D:
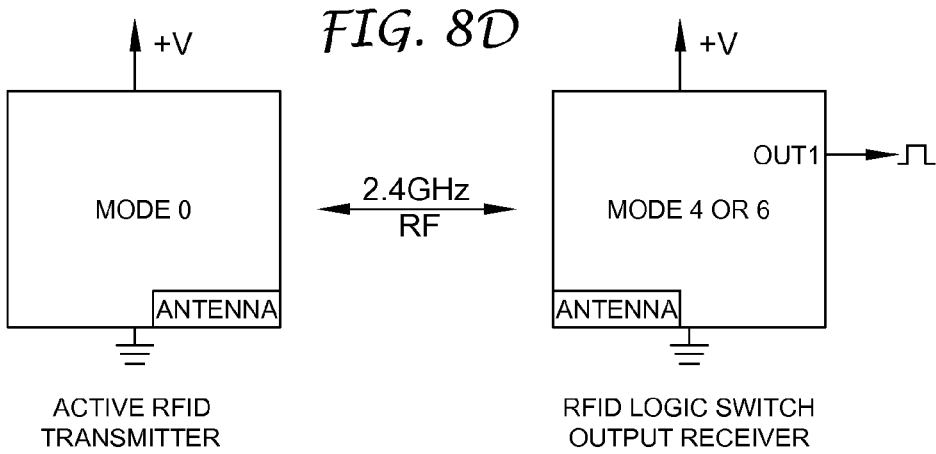
Figure 8E:
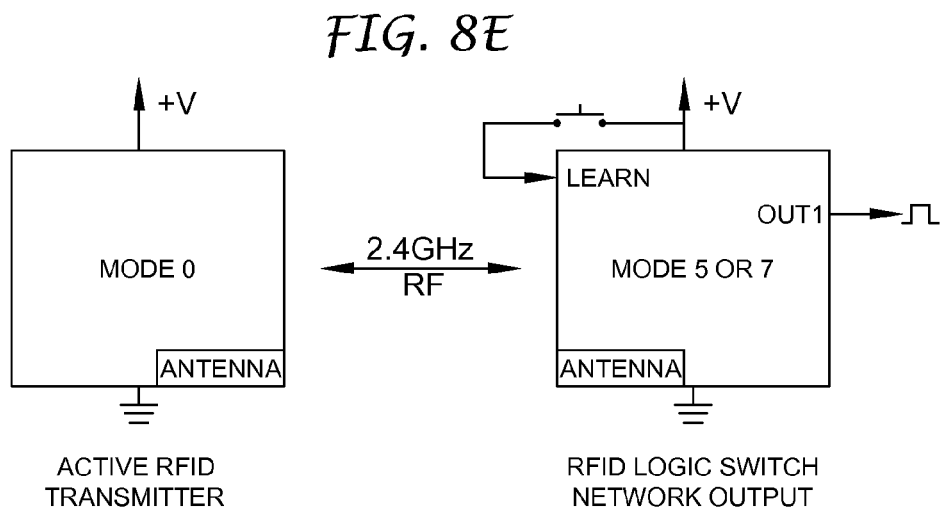
Figure 8F:
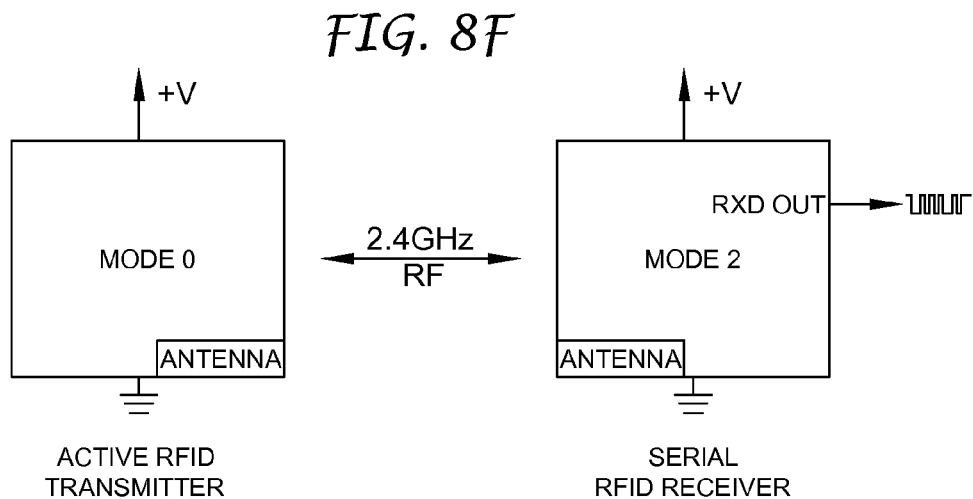
Figure 8G:
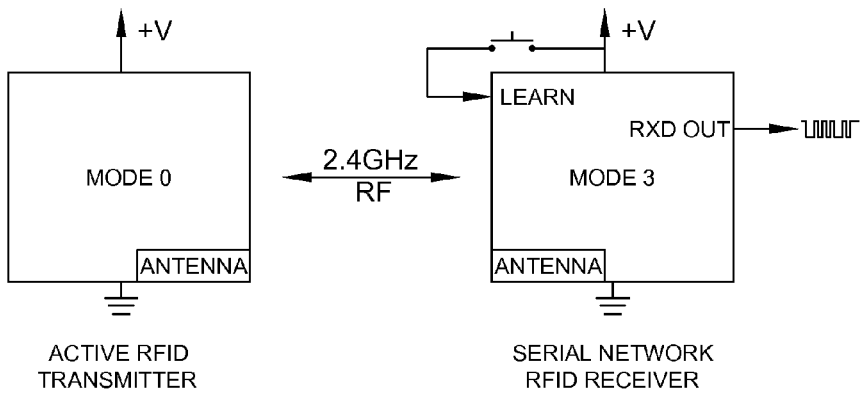
Figure 8H:
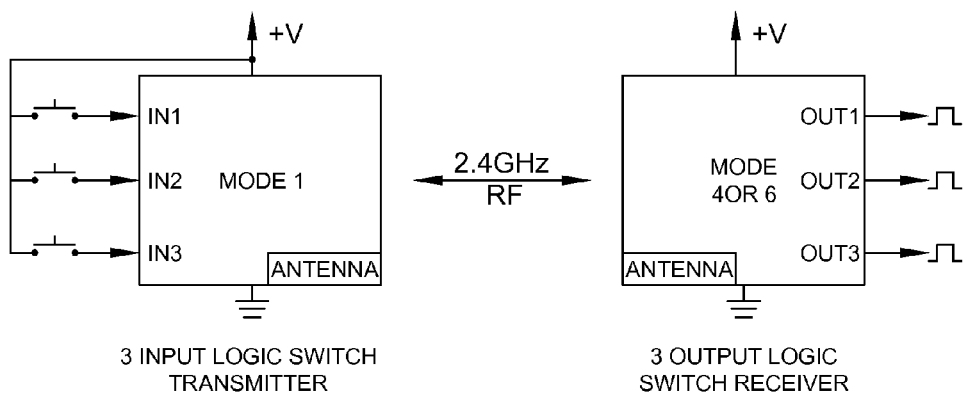
Figure 8I:
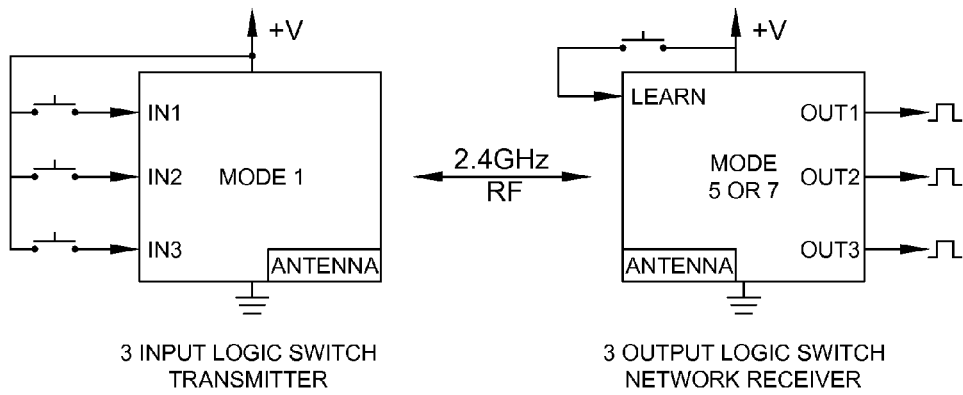
Figure 8J:
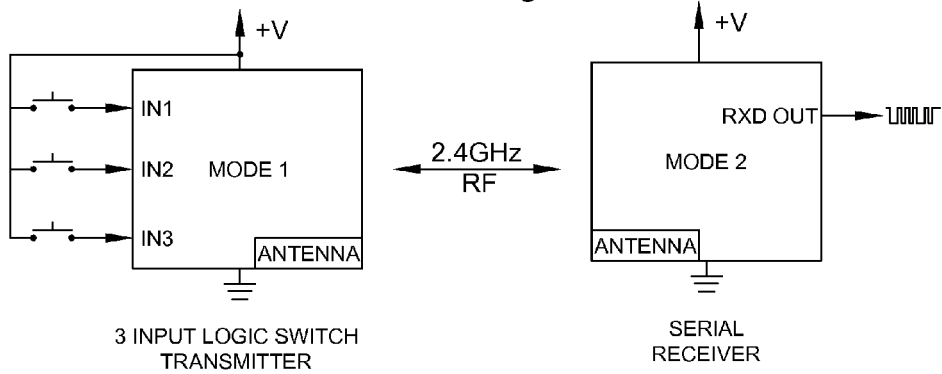
Figure 8K:
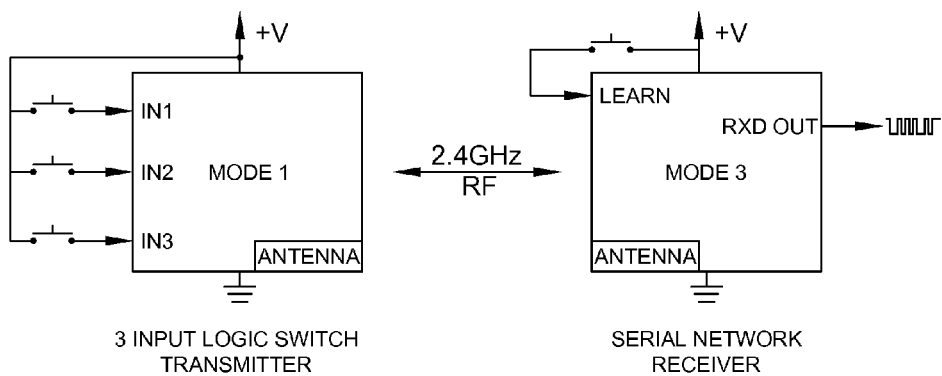
Figure 8L:
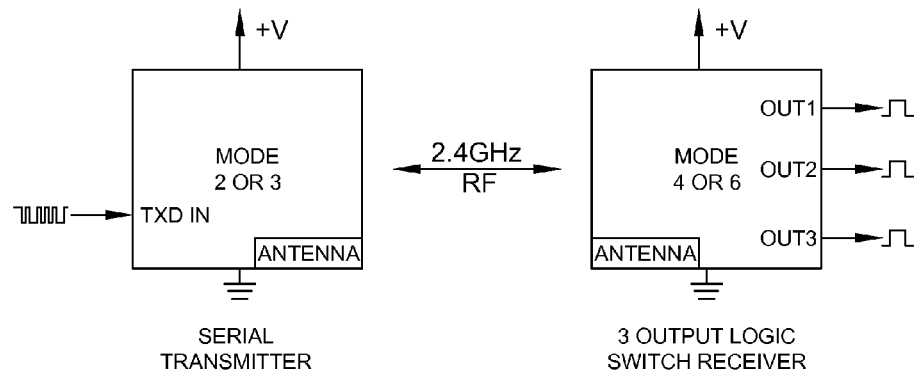
Figure 8M:
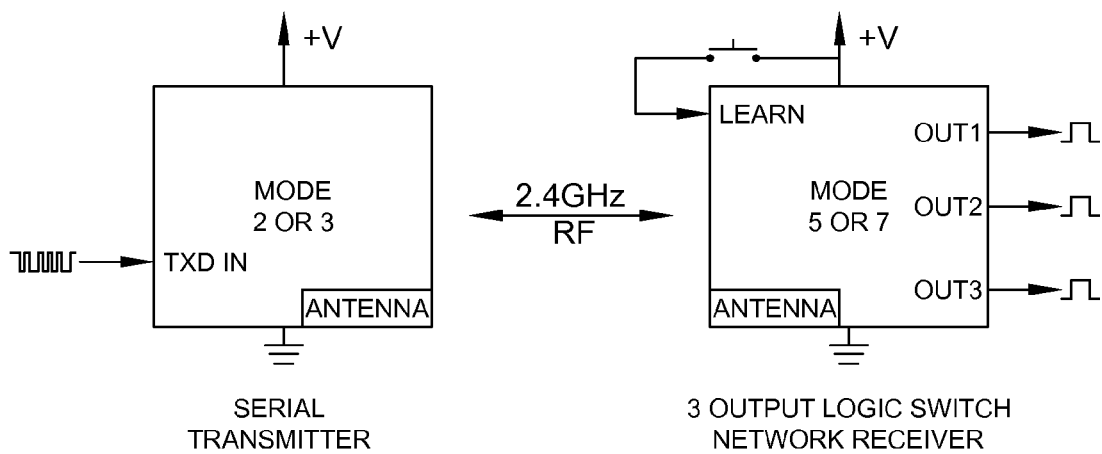
Figure 8N:
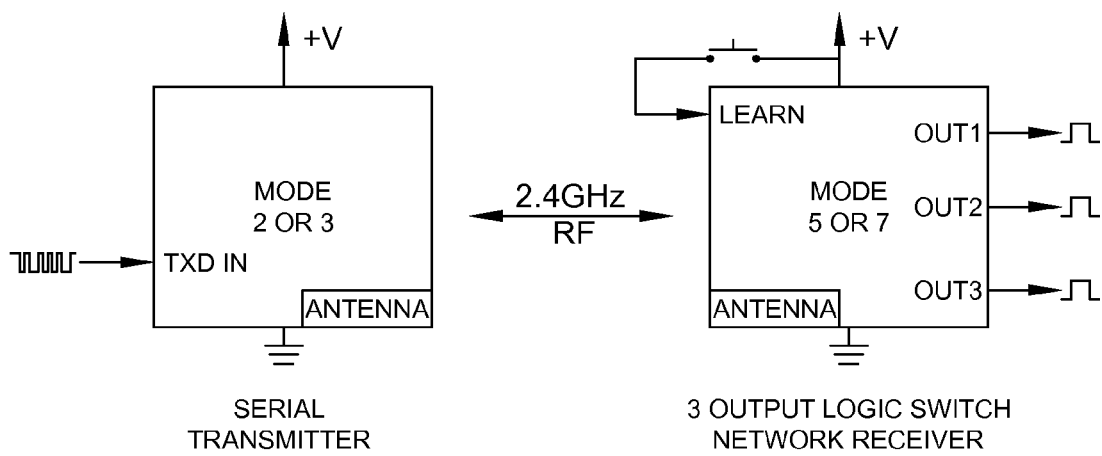

Turning now to FIGS. 8A to 8N, two or more RF modules 10 of the present invention can be used in different combinations of transceivers/transmitters and transceivers/receivers in accordance with several exemplary embodiments of the invention.

In FIG. 8A, two RF modules 10 can be set to Mode 2 when a user requires single or bidirectional data to be sent and/or received between two or more points, for example when text messaging from a portable game to others playing the same game within the area with the similar game. Gamers can communicate with each other without first requesting permission. The bidirectional serial transceiver normally sits in receive mode, receiving and outputting serial bytes out of the RXD pin, as they come in. When the user sends data into the TXD pin it automatically switches to transmit and transmits the user data.

In FIG. 8B, two RF modules 10 can be set to Mode 3 when a user requires single or bidirectional data to be sent and/or received between two or more points, for example when text messaging from a portable game to others playing the same game within the same area. The transmitting gamers must first request permission from receiving gamers before their transmissions will be accepted into their network. The bidirectional serial transceiver normally sits in receive mode, receiving and outputting serial bytes out of the RXD pin, as they come in. When user sends data into the TXD pin it automatically switches to transmit and transmits the user data. The receiver will only respond to a transmitter if it has previously learned it's ESN by pressing the learn button.

In FIG. 8C, first and second RF modules 10 can be set to Mode 2 and Mode 3, respectively, when a user requires single or bidirectional data to be sent and or received between two or more points, for example when text messaging from a portable game to others playing the same game within the same area. The transmitting gamers must first request permission from receiving gamers before their transmissions will be accepted, if they have (Mode 3) network mode selected. However if they choose to receive from everyone without first having to grant permission by learning their ESN, then they can use non-network mode 2.

In FIG. 8D, a first RF module 10 can be set to Mode 0 and a second RF module 10 can be set to either Mode 4 or Mode 6, when a user requires a transmitter to automatically transmit an Electronic Serial Number (ESN) at a predetermined interval to be received by another device which provides a signal output indicating presence of the transmitter, where a Mode 0 transmitter will be placed in a battery powered ID badge carried or worn by people in a building. When the transmitter comes within communication distance the Mode 4 receiver, the receiver can output a pulse to activate an electronic door opener, for example. So long as the person is within communication distance of Mode 4 receiver (which can be mounted on or near the door), the door will be activated. This configuration can also be used to open large gates which take a long time to open. When a car approaches the Mode 4 RFID receiver within range of the Mode 0 RFID transmitter running in Mode 0, which can be up to 300 ft. or more, the gate will have time to open by the time the car arrives to thereby reduce or eliminate wait time. Mode 6 is the same as Mode 4 but with a shorter hold time of the outputted pulse, as shown in FIG. 7A.

In FIG. 8E, a first RF module 10 can be set to Mode 0 and a second RF module 10 can be set to either Mode 5 or Mode 7, when a user requires a transmitter to automatically transmit an Electronic Serial Number (ESN) at a predetermined interval to be received by another device which provides a signal output indicating the transmitter presence, for example where a Mode 0 transmitter will be placed in a battery powered ID badge carried or worn by a person in a building. When the transmitter comes within communication distance the Mode 5 receiver, the receiver can output a pulse to activate an electronic door opener, for example. So long as the person is within communication distance of the Mode 5 receiver (which can be mounted on or near the door), the door will be activated so long as the Mode 5 receiver has learned the RFID transmitter's ESN. This configuration can also be used to open large gates which take a long time to open. When a car approaches the Mode 5 RFID receiver within range of the Mode 0 RFID transmitter running in Mode 0, which can be up to 300 ft. or more, the gate will have time to open by the time the car arrives to thereby reduce or eliminate wait time. Mode 7 is the same as Mode 5 but with a shorter hold time of the outputted pulse, as shown in FIG. 7A.

In FIG. 8F, a first RF module 10 can be set to Mode 0 and a second RF module 10 can be set to Mode 2 when a user requires a transmitter to automatically transmit an Electronic Serial Number (ESN) at a predetermined time interval for reception by another device which provides a serial output to the user containing the ESN of the sending RFID transmitter. For example, when it is desirous to know the location of employees within a building, they can be provided with a unique ID tag with the RFID transmitter in Mode 0 with a unique ESN. The Mode 2 receiver detects all the RFID tags and notifies a local computer to which it's connected of each employee's location within the limits of the building at all times. The RXD pin will output 5 bytes. Byte 1 will have bit 4 and bit 1 set, and bytes 2-5 are the 32 bit ESN of the RFID transmitter.

In FIG. 8G, a first RF module 10 can be set to Mode 0 and a second RF module 10 can be set to Mode 3 when a user requires a transmitter to automatically transmit an Electronic Serial Number (ESN) at a predetermined time interval for reception by another device which provides a serial output to the user containing the ESN of the sending RFID transmitter. For example, when it is desirous to know the location of employees within a building, they can be provided with a unique ID tag with the RFID transmitter in Mode 0 with a unique ESN. The Mode 3 receiver detects all of the RFID tags and notifies a local computer to which it's connected, of each employee's location within the limits of the building at all times. The receiver will only output the ESN of RFID transmitters which it recognizes through a previous learning step and will ignore all others, allowing grouping (networking), so multiple networks can all co-exist in the same area without interfering with each other. The RXD pin will output 5 bytes. Byte 1 will have bit 4 and bit 1 set, and bytes 2-5 are the 32 bit ESN of the RFID transmitter.

In FIG. 8H, a first RF module 10 can be set to Mode 1 and a second RF module 10 can be set to Mode 4 or Mode 6 when a user requires a momentary switch on/off signal to be sent from one point to one or many other points, such as for use in a garage door opener. The user presses the button on the transmitter causing it to send a signal to the receiver which is located at the garage door. The receiver is operably connected to the garage door motor and opens or closes the garage door. One transmitter can selectively open and close up to 3 garage doors eliminating the need for multiple garage door openers for more than one door.

In FIG. 8I, a first RF module 10 can be set to Mode 1 and a second RF module 10 can be set to Mode 5 or Mode 7 when a user requires a momentary switch on/off signal to be sent from one point to one or many other points, such as for use in a garage door opener. The user presses the button on the transmitter causing it to send a signal to the receiver which is located at the garage door. The receiver is operably connected to the garage door motor and opens or closes the garage door only if the receiver has previously learned the ESN of the transmitter. One transmitter can selectively open and close up to 3 garage doors eliminating the need for multiple garage door openers for more than one door. The receiver will only respond to the transmitter if it has first learned its ESN.

In FIG. 8J, a first RF module 10 can be set to Mode 1 and a second RF module 10 can be set to Mode 2 when a user requires a momentary switch on/off signal to be sent from one or many points to one or many other points, such as in a home security system were the transmitters inputs would be connected to one or multiple door or windows sensors. When a door or window is opened or breached, the transmitter would send the door or window status along with the ESN of the transmitter to the receiver. The receiver would output the transmitters status of the door or window, along with its ESN, in a serial stream to the home security system identifying which door or window is opened or breached.

In FIG. 8K, a first RF module 10 can be set to Mode 1 and a second RF module 10 can be set to Mode 3 when a user requires a momentary switch on/off signal to be sent from one or many points to one or many other points, such as in a home security system were the transmitters inputs would be connected to one or multiple door or windows sensors. When a door or window is opened or breached, the transmitter would send the door or window status along with the ESN of the transmitter to the receiver. The receiver would output the transmitters status of the door or window, along with its ESN, in a serial stream to the home security system identifying which door or window is opened or breached. The receiver will only respond to door or window transmitters it has previously learned, and therefore allow many different security systems to function in the same area without interference with each other.

In FIG. 8L, a first RF module 10 can be set to Mode 2 or Mode 3 and a second RF module 10 can be set to Mode 4 or Mode 6 when a user wishes to turn on or off many switch devices all at one time from a single point, such as remotely turning off all of the lights in a building from a single light switch. The user would send a serial byte into the transmitter which represents the switch on/off combinations to control. An unlimited number of Mode 4 or 6 receivers would be located at the same number of lights and be responsive to the single light switch transmitter to simultaneously turn on or off all of the lights.

In FIG. 8M, a first RF module 10 can be set to Mode 2 or Mode 3 and a second RF module 10 can be set to Mode 5 or Mode 7 when a user wishes to turn on or off many switch devices all at one time from a single point, such as remotely turning off all of the lights in a building from a single light switch. The user would send a serial byte into the transmitter which represents the switch on/off combinations to control. An unlimited number of Mode 5 or 7 receivers would be located at the same number of lights and be responsive to the single light switch transmitter to simultaneously turn on or off all of the lights. The lights would only respond to on/off switch commands if each receiver at each light switch has previously learned the transmitter's ESN.

In FIG. 8N, a first RF module 10 can be set to Mode 2 or Mode 3 and a second RF module can be set to Mode 5 or Mode 7 when a user wishes to control a sprinkler system. A Mode 2 or 3 transmitter would be connected to the computer controlled sprinkler timer, and Mode 5 or 7 receivers would be connected to each sprinkler valve. The sprinkler controller would enter 5 byte serial strings into the transmitter, one byte representing an on or off, and the other 4 bytes representing the ESN of the specific sprinkler valve to control at a particular moment for a particular time period. The difference between mode 5 and 7 is the output pulse duration.

It will be understood that the above applications are given by way of example only. The number of different applications available to the user by the provision of one, two or more more RF modules 10 with several different modes of operation is virtually unlimited.

Figure 9:
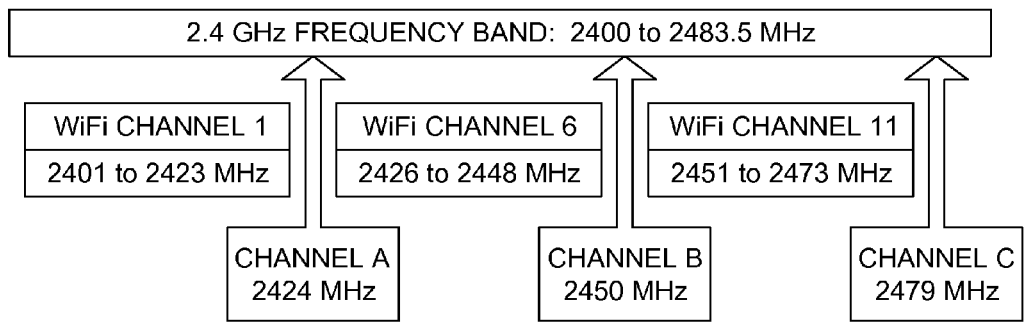
FIG. 9 is a diagram showing the manner in which the RF module of the present invention transmits/receives at exemplary frequencies between certain Wi-Fi channels to at least substantially reduce or eliminate interference from network and/or other devices operating over different frequency ranges.
Figure 10:
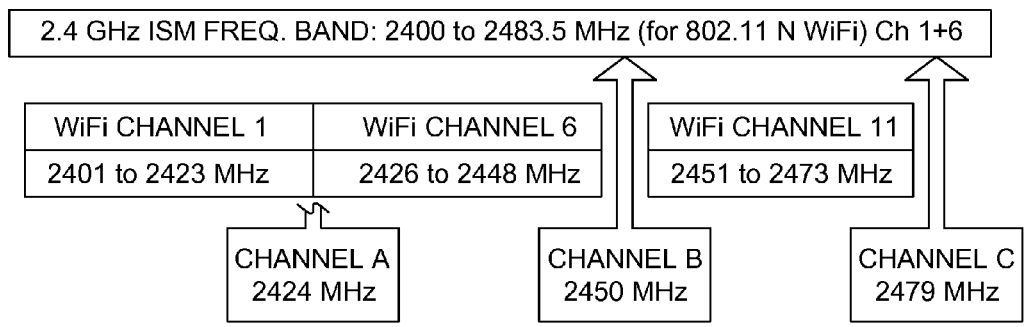
FIG. 10 is a diagram showing a method in accordance with the present invention of ensuring communication between RF modules on at least two operating bands without interference without interference from a 802.11 N Wi-Fi system operating over combined Wi-Fi channels 1 and 6.
Figure 11:
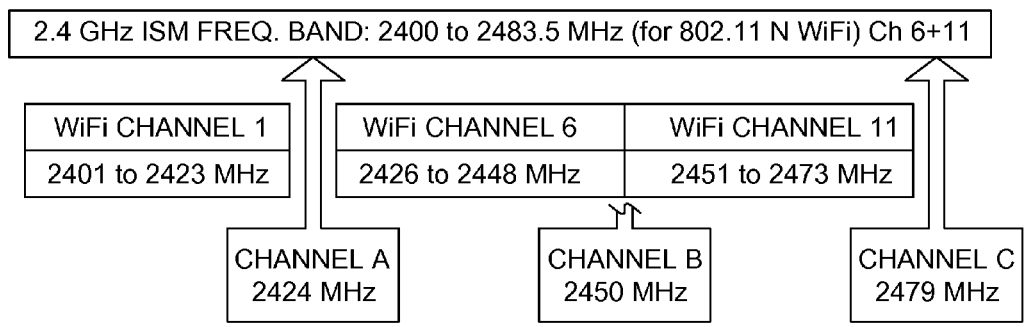
FIG. 11 is a diagram showing a method in accordance with the present invention of ensuring communication between RF modules on at least two operating bands without interference from a 802.11 N Wi-Fi system operating over combined Wi-Fi channels 6 and 11.

Referring now to FIGS. 9-11, a diagram showing a method in which the RF module 10 of the present invention transmits/receives on three different exemplary frequencies between certain Wi-Fi channels or combinations of Wi-Fi channels to at least substantially reduce or eliminate interference from network and/or other devices operating over the 2.4 GHz frequency band of 2400 MHz to 2483.5 MHz.

Wi-Fi uses a large amount of the 2.4 GHz band, and at large bandwidths, about one-third of the band per channel is consumed per Wi-Fi node. Currently, other 2.4 GHz wireless devices, such as Bluetooth, operate around Wi-Fi by employing a handshake or bidirectional system were the transmitter sends data and the receiver echoes back an acknowledgment that the data packet was received. The transmitter then sends the next packet to the receiver. If no data was received the two radios keep talking back and forth on many channels until they find a clear channel to talk on. This consumes quite a bit of current and requires a bidirectional link. This also restricts the devices to single point to single point communication. Point to multi-point communication is not possible under this system, since one transmitter sends and waits for a response to confirm receipt of its data. If there are many receivers, it is not possible for more than one receiver to talk back at a time.

The method according to the present invention allows the use of point-to-multipoint transmissions with one-way communication while substantially reducing or eliminating Wi-Fi interference. Accordingly, a high power transmitter and multiple low power receivers can be used, thereby reducing the cost and power requirements of receivers.

As shown in FIGS. 9-11, an RF module 10 is configured as a transmitter or transceiver, as discussed above. The transmitter sends the same packet of data on three different frequency channels for a predetermined number of times. In accordance with an exemplary embodiment of the present invention, the transmitter sends the same packet of date four different times on the three different frequency channels for a total of 12 transmissions. Channel A is on the low end of the band at 2424 MHz between Wi-Fi channels 1 and 6, channel B is in the middle of the band at 2450 MHz between Wi-Fi channels 6 and 11, and channel C is on the upper end of the band at 2479 MHz above Wi-Fi channel 11. It will be understood that channels A, B and C can be located at different places along the 2.4 GHz frequency band without departing from the spirit and scope of the invention. The receiver listens on the three channels for transmitted data. Since the channels A, B and C are located between the Wi-Fi channels 1, 6 and 11, the data from all three channels should be detected by the receiver under normal circumstances since there is no interference from the Wi-Fi channels.

In FIG. 10, which schematically shows a wireless 801.11 N Wi-Fi protocol that combines Wi-Fi channels 1 and 6, channel A may experience interference while channels B and C are normally free from Wi-Fi interference.

Likewise, in FIG. 11, which schematically shows a wireless 801.11 N Wi-Fi protocol that combines Wi-Fi channels 6 and 11, channel B may experience interference while channels A and C are normally free from Wi-Fi interference.

A method of transmitting data on three separate channels A, B and C over the 2.4 GHz band includes inputting data to be transmitted by the user into the RF module 10 configured as a transmitter or transceiver. The data is packeted with a transmission ID, which includes a channel number and duplicate number for indicating how many duplicate packets have been sent over each channel. The data is sequentially transmitted on channels A, B and C.

If each transmission on a channel takes 10 milliseconds, it will take 120 milliseconds to send (10 ms×12) a one user packet to a receiver. It will be understood that more or less transmissions on more or less channels can be enabled without departing from the spirit and scope of the present invention.

A method of receiving data on three separate channels A, B and C over the 2.4 GHz band includes configuring an RF module 10 as a receiver, transceiver or repeater and scanning or switching between the channels A, B and C, not knowing where it will receive a transmission. The receiver will dwell (wait and listen) on each channel for a predetermined packet time period, such as 30 milliseconds (plus a small amount for margin of error, about 1 millisecond). When it receives at least one of the 12 transmissions it will discard the other transmissions out of the 12 and output only one packet to the user, so from the user's perspective the transmission did not encounter any interference and the communication link was virtually flawless.

If there is no Wi-Fi interference then the receiver will hear the first or second transmission. However, if there is interference, the receiver will hear the third or fourth transmission. Whether it be on the first or subsequent transmissions, the receiver will eventually hear the transmission regardless of the Wi-Fi interference. The provision of four transmission over three channels for a total of 12 transmissions ensures that even when the first transmission over the three channels are not timed correctly between the transmitter and receiver, the second transmission will be. Accordingly, the method of the present invention creates a more secure way of ensuring that all the channels are used with a high degree of likelihood that at least one of the channels during one of the transmissions of a data packet will get around the Wi-Fi interference.

Figure 12:
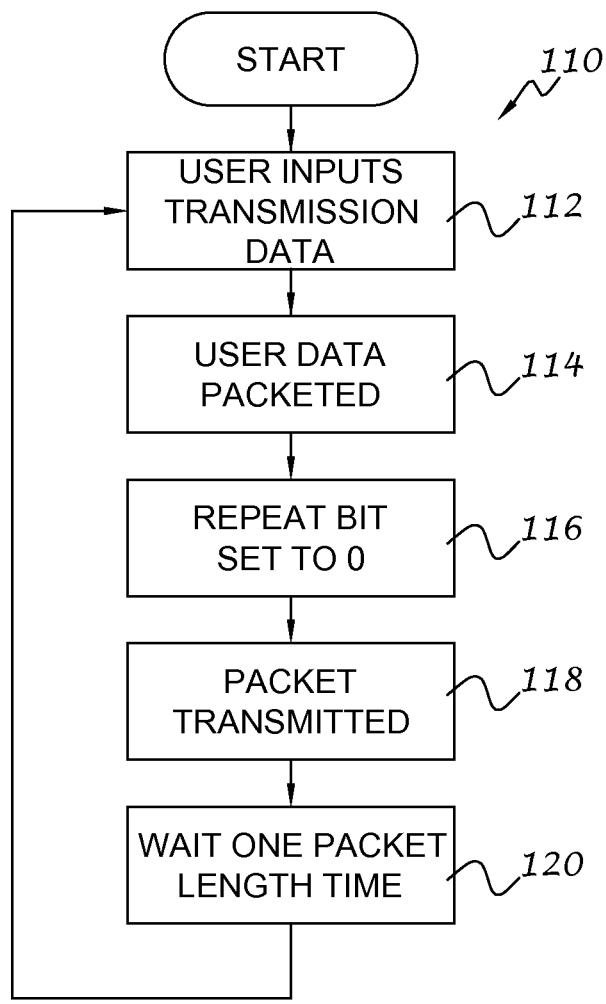
FIG. 12 is a block diagram illustrating a method in accordance with the present invention for transmitting data from a RF transmitter and/or transceiver without the necessity of a handshake from a corresponding receiver, transceiver and/or repeater.

Referring now to FIG. 12, a method 110 of sending a user packet while using the repeater function over the 2.4 GHz band is illustrated. At block 112, the user inputs data into RF module 10. The RF module 10 will then construct the user's data into a packet at block 114. The repeat bit is reset to an initialized value at block 116 and the packet, including the repeat bit value, is transmitted at block 118. At block 120, the user will pause one user packet length of time in between sending user packets, allowing time for the repeater to repeat its transmitted packets.

Figure 13:
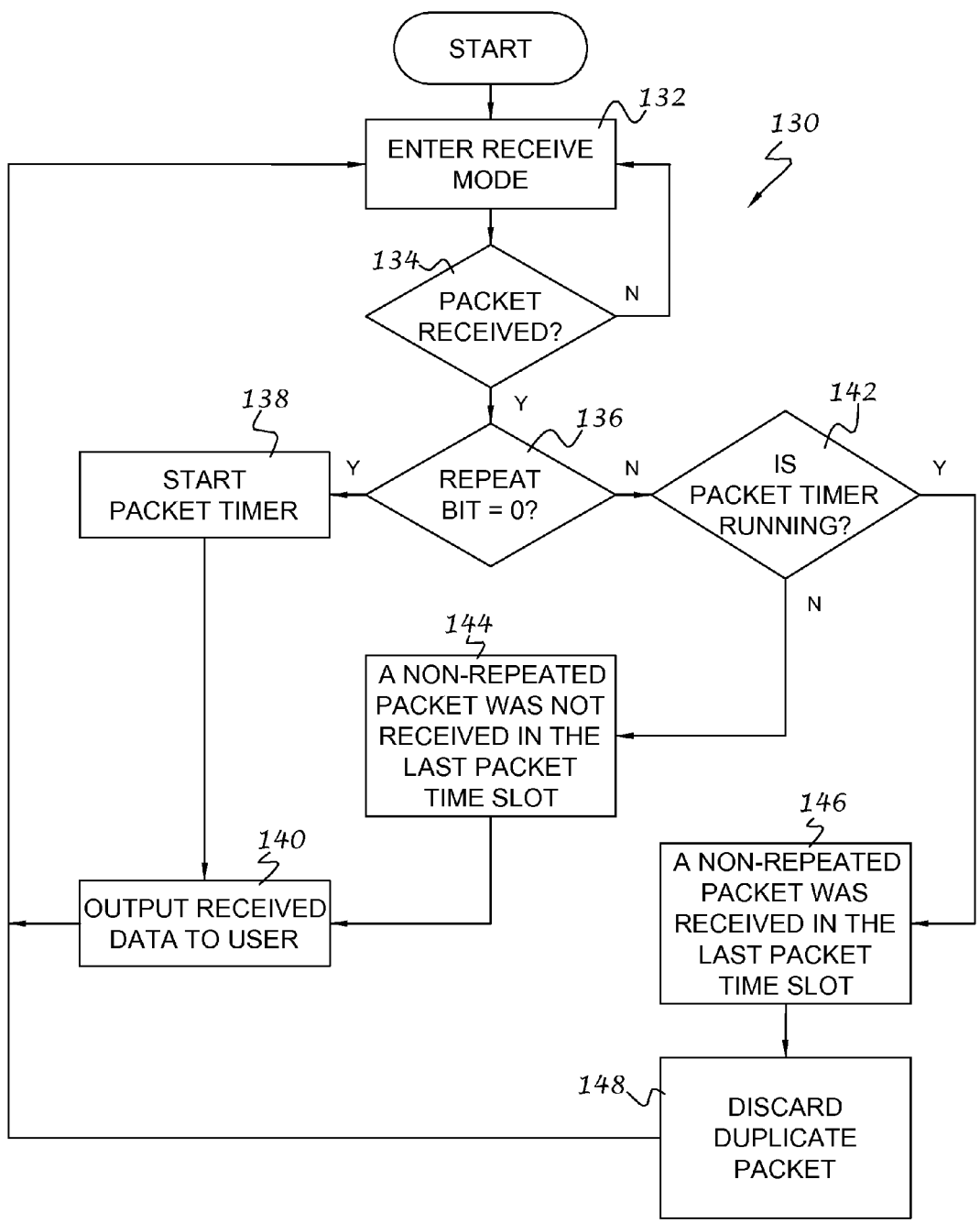
FIG. 13 is a block diagram illustrating a method in accordance with the present invention for receiving transmitted data into a receiver and/or transceiver without the necessity of transmitting a data receipt back to a transmitter, transceiver and/or repeater.

Referring now to FIG. 13, a method 130 of receiving a user packet over the 2.4 GHz band is illustrated. An RF module 10 at block 134, the receiver will wait until a packet has been received at block 134, it is then determined at block 136 whether the repeat bit as part of the transmission ID equals zero. If so, a packet timer is started at block 138 and the data is output to a user associated with the receiver at block 140. If at block 136 the repeat bit is greater than zero, it is determined at block 142 if a packet timer is currently running. If the packet timer is not currently running, it is determined at block 144 that a non-repeated packet was not received in the last packet time slot. Accordingly, the received data is output to the user at block 140. If at block 142 it is determined that the packet timer is running, it is determined at block 146 that the current packet is a repeated packet. Accordingly, the repeated packet is discarded at block 148.

Figure 14:
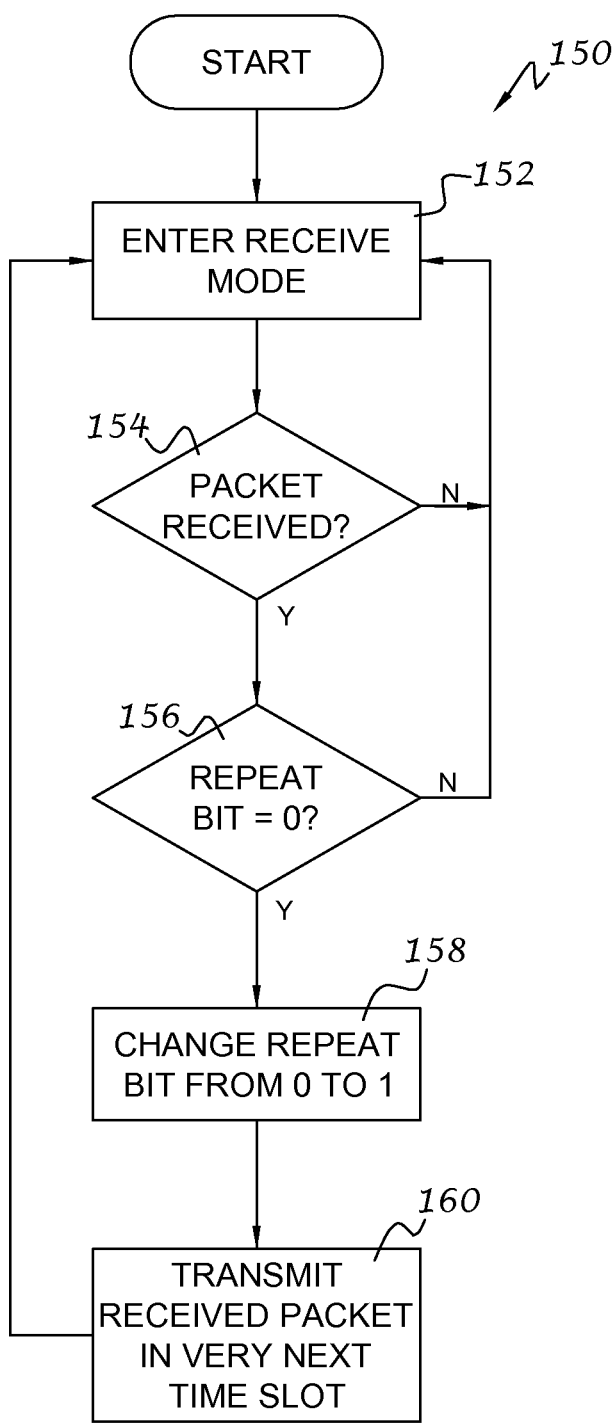
FIG. 14 is a block diagram illustrating a method in accordance with the present invention for receiving transmitted data into a repeater without the necessity of transmitting a data receipt back to a transmitter, transceiver and/or other repeater.

Turning now to FIG. 14, a method 150 of operating one or more transceivers, such as one or more RF modules 10, in a repeater mode is shown. At block 152, the repeater enters the receive mode where it waits to receive a data packet at block 154, including identifying information as to whether the data is repeated or not. The repeater function works without consuming any extra current or processing power and resources. The transmitter paces its transmissions, so for example it will send for 10 milliseconds and wait for 10 milliseconds, then send again. So if there is 30 milliseconds of data to send it take 60 milliseconds to send because it would have a quantity of three 10 millisecond pauses to transmit 30 milliseconds worth of data. In most applications the greatest value is current consumption and range, which are typically adverse to each other. The ten millisecond time period is sufficient to enable the sending of hundreds of bits of data, just one more bit of data is added to the data stream, termed a repeat bit. When the transmitter sends, it clears the repeat bit (so equals zero). This repeat bit is sent with every packet that the transmitter transmits. Accordingly, if the repeat bit equals zero, as determined at block 156, the repeat bit is changed to the value of "1" at block 158 and the data stream together with the updated repeat bit value is transmitted in the next time slot, as shown at block 160. The transmitted data stream can be sent to a receiver. Once the receiver receives the data stream, the presence of a "1" as the repeat bit value alerts the receiver that the data may be a repeat. If the repeater receives a data stream with a repeat bit having a value other than "0" then the data is rejected as being repeat data.

In accordance with a further embodiment of the invention, several single-bit-repeaters can be used to form a network of repeaters to drastically extend range. For example 4 repeat bits can be added to the overhead instead of 1 repeat bit. In this case, up to 4 repeaters can be used, each of them taking up their own time slot which would be selected by a simple user accessible switch on the repeater that would tell each of the 4 repeaters which time repeater-time-slot is allocated to it.

It will be understood that the term "preferably" as used throughout the specification refers to one or more exemplary embodiments of the invention and therefore is not to be interpreted in any limiting sense. In addition, terms of orientation and/or position as may be used throughout the specification denote relative, rather than absolute orientations and/or positions.

It will be appreciated by those skilled in the art that changes could be made to the embodiments described above without departing from the broad inventive concept thereof. By way of example, although the specification particularly discloses the use of the RF module with the 2.4 GHz frequency range, it will be understood that the module can be used with other frequencies, including but not limited to, 433 MHz, 868 MHz, 900 MHz, 5.8 GHz bands, and so on. In addition, it is contemplated that one or more of the above-described methods can be used with other transmitters, transceivers, and/or receivers. It will be understood, therefore, that the present invention is not limited to the particular embodiments disclosed, but also covers modifications within the spirit and scope of the invention as defined by the appended claims.

What is claimed is:

1. A radio frequency module comprising:
   a base member including a printed circuit board having a first surface and a second surface;
   a transceiver assembly located on the printed circuit board and including:
   a transceiver; and
   a matching/filtering network having first and second ends;
   the matching/filtering network having a plurality of passive series connected electrical components in a linear arrangement, with the first end thereof electrically connected to the transceiver;
   a ground plane formed on the first surface and surrounding at least a substantial portion of the transceiver assembly;
   a radio frequency shield electrically coupled to the ground plane and covering at least a substantial portion of the transceiver assembly;
   a chip antenna located on the first surface of the printed circuit board outside of the shield and extending generally parallel with the matching/filtering network; and
   a radio feed point extending between the chip antenna and the second end of the matching/filtering network, the chip antenna together with the matching/filtering network and the feed point forming a generally U-shape.

2. A radio frequency module according to claim 1, wherein the radio frequency shield comprises an upper wall with front, rear and side walls extending from the upward wall, a lower end of each wall being soldered to the ground plane.

3. A radio frequency module according to claim 2, wherein the front wall extends between and generally parallel to the matching/filtering network and the chip antenna, the grounded shield together with the location and orientation of the chip antenna and the matching/filtering network with respect to the front wall creating a single antenna structure that functions as a relatively large antenna in a relatively small space.

4. A radio frequency module according to claim 1, and further comprising a plurality of connector pads located on the second surface of the printed circuit board for surface mounting the radio frequency module to another printed circuit board.

5. A radio frequency module according to claim 1, and further comprising a first plurality of mode selection inputs for selecting one of a second plurality of operating modes of the radio frequency module.

6. A radio frequency module according to claim 5, wherein the second plurality is greater than the first plurality.

7. A radio frequency module according to claim 6, wherein the operating modes are selected from the group comprising: serial transceiver, serial network transceiver, active RFID transmitter, RFID logic switch output receiver, RFID logic switch network output; serial receiver, serial RFID receiver, serial network RFID receiver, input logic switch transmitter; output logic switch receiver; output logic switch network receiver; and repeater.

8. A radio frequency module according to claim 1, wherein the transceiver is configured to transmit a data packet at a plurality of different frequencies to thereby substantially reduce or eliminate radio frequency interference.

9. A radio frequency module according to claim 8, wherein the transceiver is configured to transmit the data packet multiple times over the plurality of different frequencies.

10. A radio frequency module according to claim 1, wherein the transceiver is configured to transmit a data packet on the 2.4 GHz frequency band at a plurality of different frequencies between a plurality of different Wi-Fi channels.

11. A method of wirelessly transmitting data comprising:
   transmitting a data packet on at least one frequency from a first location, the data packet including at least one repeat signal with an initialized value for a first transmission;
   receiving the data packet at a second location;
   determining whether the at least one repeat signal is at the initialized value;
   transmitting the data packet to a third location with a modified repeat bit when the at least one repeat signal is the initialized value; and
   discarding the data packet when the value of the at least one repeat signal is different from the initialized value.

* * * * *